US008502067B2

(12) United States Patent
Akimoto

(10) Patent No.: US 8,502,067 B2
(45) Date of Patent: Aug. 6, 2013

(54) METHOD OF MANUFACTURING SOLAR CELL ELECTRODE AND CONDUCTIVE PASTE

(75) Inventor: Hideki Akimoto, Kawaskaki Kanagawa (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/585,049

(22) Filed: Aug. 14, 2012

(65) Prior Publication Data

US 2013/0068827 A1    Mar. 21, 2013

Related U.S. Application Data

(60) Provisional application No. 61/536,714, filed on Sep. 20, 2011.

(51) Int. Cl.
*H01B 1/16*    (2006.01)
*H01L 31/0224*    (2006.01)

(52) U.S. Cl.
USPC .......................................... 136/256; 252/500

(58) Field of Classification Search
USPC .................................. 136/243–265; 252/500
See application file for complete search history.

(56) References Cited

U.S. PATENT DOCUMENTS

| | | | |
|---|---|---|---|
| 6,395,375 B1 * | 5/2002 | Imamura et al. | 428/32.52 |
| 6,841,728 B2 * | 1/2005 | Jones et al. | 136/244 |
| 7,976,734 B2 * | 7/2011 | Akimoto | 252/514 |
| 2006/0283496 A1 * | 12/2006 | Okamoto et al. | 136/244 |
| 2008/0196757 A1 | 8/2008 | Yoshimine | |

* cited by examiner

*Primary Examiner* — Kevin P Kerns
*Assistant Examiner* — Kevin E Yoon

(57) ABSTRACT

The present invention relates to a method of manufacturing a solar cell electrode, comprising: preparing a semiconductor substrate having a preformed electrode on a front side, a back side, or both of the front and the back side of the semiconductor substrate; applying a conductive paste onto the preformed electrode, wherein the conductive paste comprises a conductive powder, an amorphous saturated polyester resin with glass transitional temperature (Tg) of 50° C. or lower, and an organic solvent; drying the applied conductive paste; putting a tab electrode on the dried conductive paste; and soldering the tab electrode.

7 Claims, 6 Drawing Sheets

_METHOD OF MANUFACTURING SOLAR CELL ELECTRODE AND CONDUCTIVE PASTE_

FIELD OF THE INVENTION

The invention relates to a solar cell electrode, more specifically to a conductive paste to form a solar cell electrode and a method of manufacturing a solar cell electrode.

TECHNICAL BACKGROUND OF THE INVENTION

There are two kinds of conductive pastes. One is a firing type that contains glass frit to adhere to a substrate by melting during firing at high temperature, for example 500° C. or higher. The other is a polymer type of conductive paste that contains substantially no glass frit and adheres to a substrate by a polymer resin itself in the conductive paste by being heated at relatively low temperature, for example 300° C. or lower. A solar cell electrode manufactured by using a polymer type conductive paste is required because it does not need a high temperature in a firing step. However, a solar cell electrode made of the polymer type conductive paste sometimes peels off by an effect of soldering heat.

US20080196757 discloses a solar cell electrode formed by a conductive composition including conductive particles, and a thermosetting epoxy resin composition.

SUMMARY OF THE INVENTION

An objective of the present invention is to provide a polymer type conductive paste to form a solar cell electrode with sufficient adhesion between a substrate and the electrode as well as between the electrode and a copper ribbon attached by soldering.

An aspect of the invention relates to a method of manufacturing a solar cell electrode, comprising: preparing a semiconductor substrate having a preformed electrode on a front side, a back side, or both of the front and the back side of the semiconductor substrate; applying a conductive paste onto the preformed electrode, wherein the conductive paste comprises a conductive powder, an amorphous saturated polyester resin with glass transitional temperature (Tg) of 50° C. or lower, and an organic solvent; drying the applied conductive paste at from 80 to 250° C.; putting a tab electrode on the dried conductive paste; and soldering the tab electrode.

Another aspect of the invention relates to a conductive paste for manufacturing a solar cell electrode, comprising, based on the total weight of the conductive paste; 40 to 90 weight percent of a conductive powder;

5 to 50 weight percent of a solvent; and 3 to 20 weight percent of an amorphous saturated polyester resin with Tg of 50° C. or lower.

A solar cell electrode by the present invention can obtained sufficient adhesion.

DETAILED DESCRIPTION OF THE INVENTION

A method for manufacturing a solar cell electrode of the present invention is described below along with figures as well as a conductive paste used in the method.

(Method of Manufacturing a Solar Cell Electrode)

There are several types of a solar cell, such as a hybrid type, a crystal type, an amorphous type, or a thin film type. However, type of a solar cell is not limited.

Figure 1:
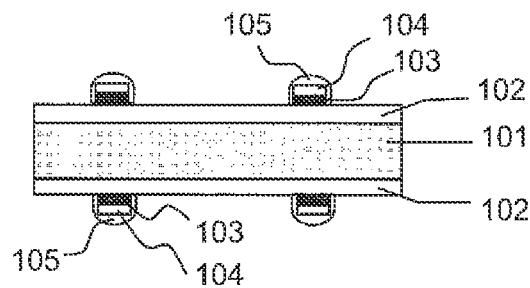
FIG. 1 is a cross-sectional schematic drawing of a hybrid type solar cell.

In an embodiment, a solar cell can be a hybrid type solar cell. In case of the hybrid type, a substrate can comprise a semiconductor substrate, 101, and a transparent electrode, 102. The transparent electrode, 102, can be formed on both a front side and a back side of the semiconductor layer, 101, as shown FIG. 1. The transparent electrode, 102, can be made from indium titanium oxide (ITO). The preformed electrode is the transparent electrode, 102, in this case.

The semiconductor layer, 101, of the hybrid type solar cell, can be at least three layered of a mono-crystal semiconductor layer and amorphous semiconductor layers on both front and back sides of the mono-crystal semiconductor layer.

"Front side" is defined in this specification as a side receiving sunlight when it is introduced to generate electricity from the sunlight. "Back side" is defined as the opposite side of the front side.

A collective electrode, 103, can be formed on the transparent electrode, 102, at both of the front side and the back side. The collective electrode, 103, on the front side can be connected to the collective electrode on the back side of an adjacent solar cell by using a tab electrode, 104. The tab electrode, 104, can be covered by solder, 105, to adhere. The conductive paste of the present invention can be used for the collective electrode, 103. Consequently, the solar cell can secure firm adhesion of the collective electrode and the tab electrode even after the soldering.

Figure 2A:
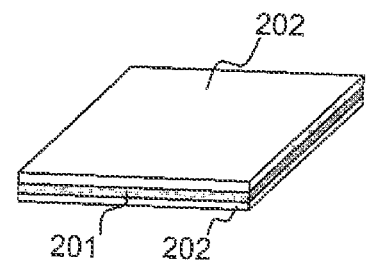
FIGS. 2(a) to 2(d) are drawings for explaining a method of forming a hybrid type solar cell electrode.
Figure 2B:
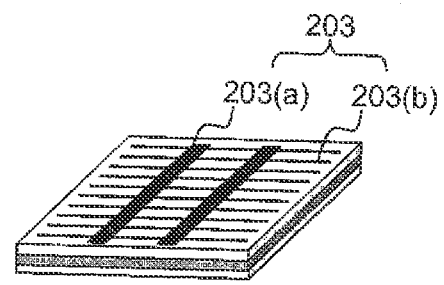
Figure 2C:
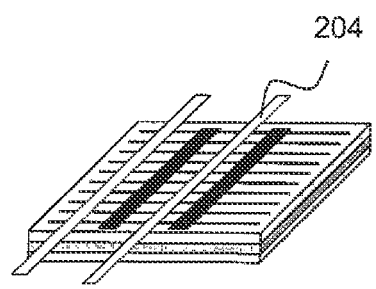
Figure 2D:
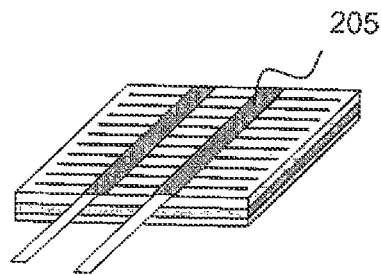
Figure 3A:
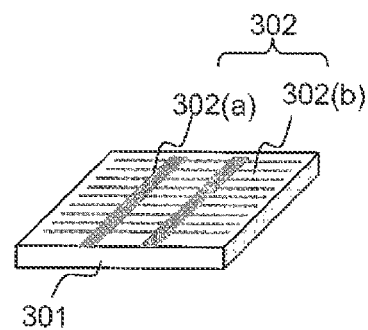
FIGS. 3(a) to 3(c) are drawings for explaining a method of forming a crystal type solar cell electrode at the front side.
Figure 3B:
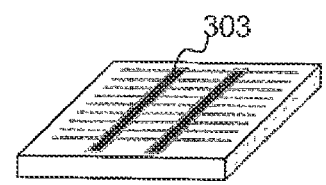

A method of manufacturing a solar cell is explained according to FIG. 2 to FIG. 4.

In an embodiment, a semiconductor substrate, 201, having the transparent electrodes, 202, as a preformed electrode is prepared as illustrated in FIG. 2(a). The transparent electrode, 202, can be formed at least on the front side of the semiconductor substrate, 201. However, it is also possible to form the transparent electrode, 202, on the both of the front side and the back side as illustrated in FIG. 2(a). The transparent electrode, 202, can be formed by, for example, chemical vapor deposition (CVD) with ITO.

Applying the conductive paste, 203, onto the transparent electrode layer, 202, at the front side is carried out to form the collective electrode. Applying can be carried out by screen printing the conductive paste, 203, especially when forming a fine line pattern. The pattern of the applied conductive paste, 203, can be a comb shape that comprises at least one line of bus bar, 203(a), and many fine finger lines, 203(b) as shown FIG. 2(b). The bus bar, 203(a), crosses over the finger lines, 203(b), to transfer electricity which the semiconductor layer, 101, generates through the transparent electrode, 202, and the finger lines, 203(b).

Viscosity of the conductive paste can be from 50 to 300 Pascal second at 10 rpm from the view point of applying method. For example, when applying it by screen printing, viscosity can be from 100 to 300 Pascal second at 10 rpm. The viscosity can be measured with a viscometer Brookfield HBT SSA14/6R using a spindle #14 at 10 rpm at room temperature.

Drying is then carried out in an oven or on a hotplate. The drying temperature can be from 50 to 250° C. The drying time can be from 1 to 30 minutes. Under the drying temperature and time, organic solvent can sufficiently evaporate to dry up. The conductive paste would be then hardened to become an electrode after drying up.

The thickness of the collective electrode, 203, can be at least 10 μm in an embodiment, at least 15 μm in another embodiment, at least 20 μm in another embodiment. With such thickness, the adhesion of the electrode can be sufficient as shown in Example below. There is no limitation of the maximum thickness, because the thicker an electrode thickness is, the lower resistance an electrode could obtain. However, in consideration that a fine pattern is required on a solar cell electrode, the thickness of the electrode can be not larger than 100 μm in an embodiment, not larger than 80 μm in another embodiment, not larger than 70 μm in another embodiment.

A tab electrode, 204, for interconnecting solar cells can be put on the bus bar, 203(a), as shown in FIG. 2(c). The tab electrode, 204, is then covered with solder, 205, to adhere as shown in FIG. 2(d). The solder, 205, can be heated at 200 to 300° C. to melt and cover the bus bar, 203(a). When soldering, the conductive paste could be adequately melt by the heat to firmly adhere to the substrate. An amorphous saturated polyester resin which is a thermoplastic in the conductive paste would have effect on the adhesion. In an embodiment, a solder ribbon comprising a copper ribbon as a tab electrode coated with a solder paste can be used to have the forming steps simpler.

FIG. 3 illustrates another embodiment of a crystal type solar cell. In the crystal type solar cell, a semiconductor substrate having a collective electrode comprising at least a bus bar, 302(a), and a finger line, 302(b), at the front side of the semiconductor substrate, 301, is prepared as shown in FIG. 3(a). The collective electrode, 302, can be formed by applying a conductive paste comprising a conductive powder, glass powder, and an organic medium and then firing the conductive paste at from 400° C. to 900° C. The preformed electrode is the collective electrode, 302, in this case.

The conductive paste, 303, is then applied on the preformed bus bar, 302(a). The conductive paste, 303, can be applied at least partially onto the bus electrode. It is not necessary to apply it onto the entire surface of the bus electrode. However, when desiring to increase adhesion of a solar cell electrode, the conductive paste, 303, can be applied entirely onto the bus bar, 302(a). Method of applying and drying the conductive paste, 304, can be same as explained above.

Figure 3C:
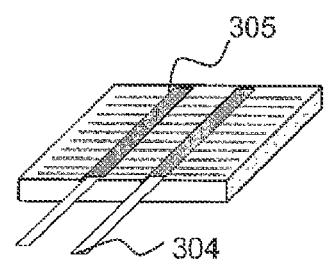

A tab electrode, 304, is then put on the dried conductive paste, 303, and then covered with solder, 305, to adhere as shown in FIG. 3(c). The soldering method can be the same as explained above.

Figure 4A:
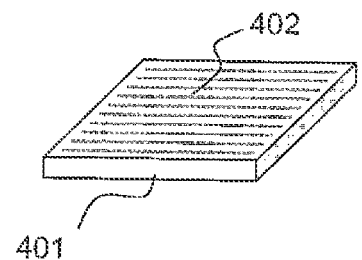
FIGS. 4(a) to 4(c) are drawings for explaining a method of forming a crystal type solar cell electrode at the front side.

The conductive paste can be used to form the bus bar at the front side of the semiconductor substrate in another embodiment as illustrated in FIG. 4. A semiconductor substrate, 401, having finger lines, 402, at least on the one side which is the front side of the semiconductor substrate, 401, is prepared as shown in FIG. 4(a). The preformed electrode is the finger lines, 402, in this case.

Figure 4B:
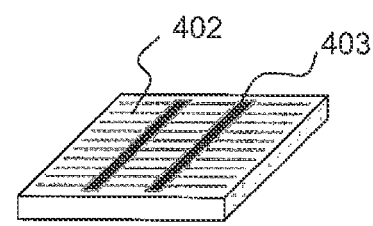

The conductive paste, 403, is applied on the preformed finger lines, 402, formed on the front side of the semiconductor substrate, 401, as illustrated in FIG. 4(b). At this time, the conductive paste, 403, crosses over the finger lines, 402, and partially attaches to the semiconductor substrate, 401, or a passivation layer in case that the passivation layer, for example a silicon nitride layer, is formed on the semiconductor substrate. It is observed in Example below that the conductive paste, 403, sufficiently adheres not only to the preformed electrode but also the silicon nitride layer.

Figure 4C:
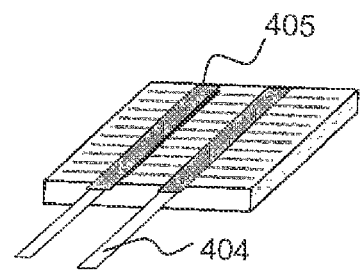

The drying step is then carried out as explained above. A tab electrode, 404, is put on the dried conductive paste, 403, and then covered with solder, 405, to adhere as shown in FIG. 4(c). The soldering method can be the same as explained above.

Figure 5A:
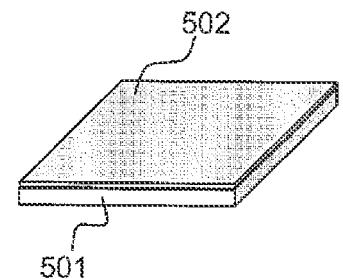
FIGS. 5(a) to 5(c) are drawings for explaining a method of forming a crystal type solar cell electrode at the back side.

The conductive paste can be used at the back side of the semiconductor substrate as illustrated in FIG. 5 in an embodiment. A semiconductor substrate, 501, having a back side electrode, 502, at the back side of the semiconductor substrate, 501, is prepared as shown in FIG. 5(a). The backside electrode, 502, can be formed by applying a conductive paste comprising at least a conductive powder and an organic medium, and firing it. The backside electrode, 502, can be formed on the most surface of the semiconductor substrate where the back side would hardly receive the sunlight. The conductive powder used in the conductive paste for the backside electrode, 502, can be an aluminum powder. The preformed electrode is the backside electrode, 502, in this case.

Figure 5B:
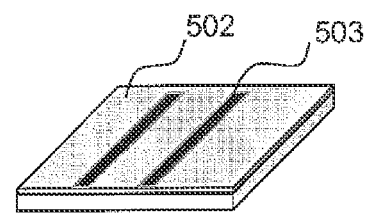
Figure 5C:
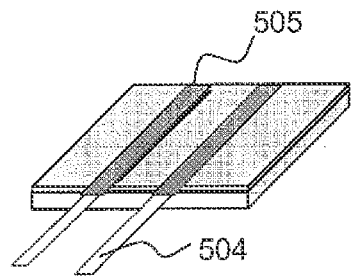

The conductive paste, 503, can be applied on the preformed back side electrode, 502, as illustrated in FIG. 5(b). A tab electrode, 504, is put on the dried conductive paste, 503, and then covered with solder, 505, to adhere as shown in FIG. 5(c). The drying and soldering step can be carried out as explained above.

Figure 6A:
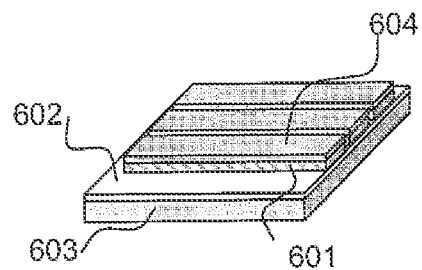
FIGS. 6(a) to 6(c) are drawings for explaining a method of forming an organic thin film solar cell electrode.

The conductive paste can be used in an organic thin film solar cell in another embodiment as illustrated in FIG. 6. A semiconductor substrate, 601, having a transparent electrode, 602, at the front side and having a backside electrode, 604, at the back side of the semiconductor substrate, 601, is prepared as shown in FIG. 6(a). A glass substrate as a supportive base is equipped at the side of the transparent electrode, 602, of the semiconductor substrate, 601. In this embodiment, the sunlight comes into the semiconductor substrate, 601, from the side of the glass substrate, 603. The semiconductor layer, 601, can be formed by chemical vapor deposition (CVD) with silicon with thickness of 100 μm or thinner. The transparent electrode, 602, can be formed by sputtering with ITO. The back side electrode, 604, can be generally formed by sputtering a metal such as silver, nickel or aluminum.

Figure 6B:
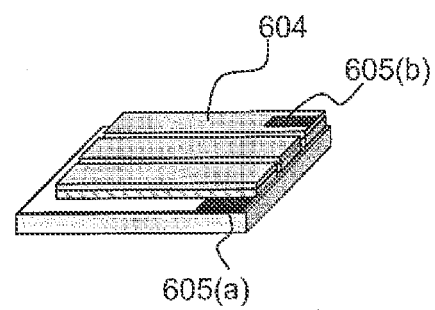
Figure 6C:
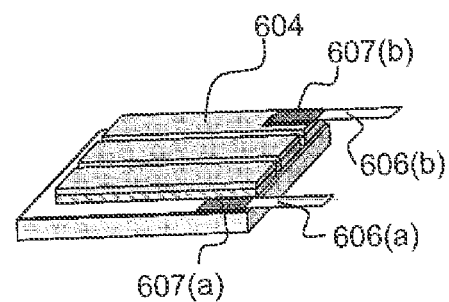

A conductive paste, 605(a), can be applied onto a part of the transparent electrode, 602, as illustrated in FIG. 6(b). In this case, the preformed electrode is the transparent electrode, 602. A tab electrode, 606(a), is put on the applied conductive paste, 605(a), and then adheres with solder, 607(a), as shown in FIG. 6(c).

In another embodiment, the conductive paste, 605(b), can be applied onto a part of the back side electrode, 604, as illustrated in FIG. 6(b). In this case, the preformed electrode is the back side electrode, 604. A tab electrode, 606(b), is put on the applied conductive paste, 605(b), and then covered with solder, 607(b), to adhere as shown in FIG. 6(c).

A method of applying the conductive paste in any embodiments above is not limited, however, it can be, for example, screen printing or nozzle discharging, offset printing method, doctor blade method or transfer method.

The conductive paste used above embodiments is explained in detail below. The conductive paste is a polymer type and contains substantially no glass frit. Even if the glass frit is contained, the amount can be 0.5 wt % or lower in an embodiment, 0.1 wt % or lower in another embodiment, based on the total weight of the conductive paste.

(Conductive Powder)

A conductive powder is a powder to transport electrical current in an electrode.

The conductive powder can be a metal powder with electrical conductivity $1.00\times10^7$ Siemens (S)/m or more at 293 Kelvin in an embodiment. Such conductive powder can be selected from the group consisting of iron (Fe; $1.00\times10^7$ S/m), aluminum (Al; $3.64\times10^7$ S/m), nickel (Ni; $1.45\times10^7$ S/m), copper (Cu; $5.81\times10^7$ S/m), silver (Ag; $6.17\times10^7$ S/m), gold (Au; $4.17\times10^7$ S/m), molybdenum (Mo; $2.10\times10^7$ S/m), magnesium (Mg; $2.30\times10^7$ S/m), tungsten (W; $1.82\times10^7$ S/m), cobalt (Co; $1.46\times10^7$ S/m), zinc (Zn; $1.64\times10^7$ S/m) and a mixture thereof.

The electrical conductivity of the conductive powder can be $3.00\times10^7$ S/m or more at 293 Kelvin in another embodiment. Such conductive powder can be selected from the group consisting of Al, Cu, Ag and a mixture thereof. Electrical property of a solar cell could be further improved by using these conductive powders with relatively high electrical conductivity. The conductive powder can be selected from the group consisting of Al, Cu, Ni, Fe and a mixture thereof in another embodiment. These metal powders that can be easily oxidized by heated at high temperature such as 400° C. could be suitable as a conductive powder in the conductive paste which is not fired or cured at such high temperature.

There is no limitation on shape of the conductive powder. However, a flake type conductive powder, spherical type conductive powder or a mixture thereof are generally often used. In an embodiment, the conductive powder shape can be the flake type conductive powder. The flake type conductive powder can increase contact area of the each other, consequently it obtains sufficient conductivity. The conductive powder can be also a mixture of spherical powder and flaky powder.

Particle diameter (D50) of the conductive powder can be 0.1 to 10.0 μm in an embodiment, 0.5 to 8 μm in another embodiment, 1 to 5 μm in another embodiment. The particle diameter within the range can be dispersed well in an organic medium. The conductive powder comprising a mixture of two or more of conductive powders with different particle diameters can be used in an embodiment. The smaller particles can fill interspaces of the larger particles so as to enhance electrode's conductivity. For example, the conductive powder can be a mixture of a conductive powder with the particle diameter of 0.1 to 3 μm and a conductive powder with the particle diameter of 4 to 10 μm.

The average diameter (D50) is obtained by measuring the distribution of the powder diameters by using a laser diffraction scattering method with Microtrac model X-100.

The conductive powder can be of ordinary high purity of 99% or higher. However, depending on the electrical requirements of the electrode pattern, less pure one can also be used. The purity of the conductive powder can be 95% or higher in another embodiment, 90% or higher in another embodiment.

The conductive powder can be 40 to 90 weight percent (wt %) in an embodiment, 50 to 80 wt % in another embodiment, 55 to 70 wt % in another embodiment, based on the total weight of the conductive paste. Within the range of conductive powder content, conductivity of the solar cell electrode can be sufficient.

(Amorphous Saturated Polyester Resin)

An amorphous saturated polyester resin is a compound synthetically-prepared by polyesterification reaction of an acid component such as polycarboxylic acid and an alcohol component such as polyalcohol. The amorphous saturated polyester resin comprises a disorder structure, for example, a structure of a polymer main-chain polymer and side-chains polymer which disorderly attached to the main-chain polymer.

The amorphous saturated polyester resin is meant to designate a polyester which shows substantially no crystallization and which does not present a melting point as measured by Differential Scanning calorimetry, for example EXSTAR6000 from Seiko Instruments Inc., with a heating gradient of 10° C. per minute.

A solar cell electrode can firmly adhere to a substrate by using the amorphous saturated polyester resin. The amorphous saturated polyester resin has thermoplastic property. "Thermoplastic" herein is defined in the specification as a nature to be deformed by an external force when heated at a temperature of Tg of the polyester resin.

The acid component can be selected from the group consisting of aliphatic dicarboxylic acid, aromatic dicarboxylic acid, alicyclic dicarboxylic acid and a mixture thereof, in an embodiment.

The aliphatic carboxylic acid can be selected from the group consisting of azelaic acid, succinic acid, dimer acid, sebacic acid, adipic acid, dodecanedioic acid, and a mixture thereof in an embodiment.

The aromatic carboxylic acid can be selected from the group consisting of isophthalic acid, terephthalic acid, orthophthalic acid, hexahydrophthalic acid, maleic acid, benzene tricarboxylic acid, benzene tetracarboxylic acid and a mixture thereof, in an embodiment.

The alicyclic carboxylic acid can be cyclohexanedicarboxylic acid or decanedicarboxylic acid, in an embodiment.

The alcohol component can be selected from the group consisting of ethylene glycol, neopentyl glycol, butyl glycol, propylene glycol, 1,5-Pentanediol, 1,6-Hexanediol, orthoxylene glycol, paraxylene glycol, 1,4-Phenylene glycol, and bisphenol-A. These alcohol ethylene oxide adduct can be also used.

The amorphous saturated polyester resin can be made by a known method such as dehydration and condensation reaction of the acid component and the alcohol component.

Average molecular weight of the amorphous saturated polyester resin can be from 2,000 to 50,000. When the average molecular weight is in the range, the paste viscosity could be proper.

Glass transition temperature (Tg) of the amorphous saturated polyester resin is 50° C. or less. An amorphous saturated polyester resin with Tg within the range can obtain sufficient adhesion even after soldering as shown in Example below.

In an embodiment, the amorphous saturated polyester resin can be at least 3 wt %, 4.5 wt % in another embodiment, 5 wt % in another embodiment, 6 wt % in another embodiment, based on the total weight of the conductive paste. The amorphous saturated polyester resin can be not more than 20 wt % in an embodiment, not more than 18 wt % in another embodiment, not more than 15 wt % in another embodiment, not more than 10 wt % in another embodiment, based on the total weight of the conductive paste. With such amount of the amorphous saturated polyester resin, conductive powder and glass frit could sufficiently disperse.

(Organic Solvent)

An organic solvent is an organic compound dissolving the amorphous saturated polyester resin.

The organic solvent can comprise ketone solvent, aromatic solvent, ester solvent, glycol ether solvent, glycol ether acetate solvent, and terpenoid solvent, in an embodiment.

The ketone solvent can be selected from the group consisting of acetone, methyl ethyl ketone, 1-Nonanal, methyl isobutyl ketone, cyclohexanone and a mixture thereof.

The aromatic solvent can be selected from the group consisting of toluene, xylene, benzene, ethyl benzene, trimethyl benzene, alkyl benzene and a mixture thereof.

The ester solvent can be selected from the group consisting of methyl acetate, ethyl acetate, propyl acetate, isopropyl acetate, butyl acetate, isobutyl acetate, amyl acetate, isoamyl acetate, and a mixture thereof.

The glycol ether solvent can be selected from the group consisting of ethylene glycol monomethyl ether, ethylene glycol monoethyl ether, ethylene glycol monobutyl ether, diethylene glycol monoethyl ether, diethylene glycol monobutyl ether, propylene glycol monoethyl ether, propylene glycol n-butyl ether, propylene glycol n-propyl ether, propylene glycol phenyl ether, dipropylene glycol methyl ether, dipropylene glycol n-butyl ether, dipropylene glycol n-propyl ether, dipropylene glycol methyl ether, tripropylene glycol methyl ether, tripropylene glycol n-butyl ether, and a mixture thereof.

The glycol ether acetate solvent can be selected from the group consisting of ethylene glycol monomethyl ether acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, dipropylene glycol methyl ether acetate, and a mixture thereof.

The Terpene solvent can be selected from the group consisting of terpineol, limonene, pinene, and a mixture thereof.

The organic solvent can comprise a glycol ether, glycol ether acetate, alkyl benzene, terpineol or a mixture thereof, in an embodiment. These organic solvent evaporates quickly.

Any other solvent can be added to the forementioned solvents. A solvent to add can be an aliphatic solvent, an alcohol solvent or a mixture thereof that is compatible with the above forementioned solvents.

Flash point of the solvent is adjustable depending on how to apply the conductive paste. For example, the flash point can be at least 70° C. when the conductive paste is applied by screen printing.

Evaporation rate is also adjustable depending on how to apply the conductive paste. For example, the evaporation rate which is expressed by a relative value when that of butyl acetate is 100 can be not more than 50 when the conductive paste is applied by screen printing, Content of the organic solvent can be adjusted by type or amount of the amorphous saturated polyester resin or the conductive powder. The organic solvent can be 5 to 50 wt % in another embodiment, 10 to 40 wt % in another embodiment, 15 to 30 wt % in an embodiment, based on the total weight of the conductive paste. With such content, the amorphous saturated polyester resin can be dissolved sufficiently or a conductive powder can be dispersed in a mixture of the resin and the solvent sufficiently.

(Additives)

Thickener, stabilizer, viscosity modifier, oxidation inhibitor, UV absorber, or surfactant as additives can be added to a conductive paste. Amount of the additive depends on a desired characteristic of the resulting electrically conducting paste and can be chosen by people in the industry. The additives can also be added in multiple types.

EXAMPLES

The present invention is illustrated by, but is not limited to, the following examples.

(Conductive Paste Preparation)

The conductive paste was produced using the following materials. The weight percent (wt %) herein means weight percent based on the total weight of the conductive paste unless especially defined.

Conductive Powder: 60 wt % of silver (Ag) powder was used. The shape was flake. The particle diameter (D50) was 3.0 μm as determined with a laser scattering-type particle size distribution measuring apparatus (Microtrac model X-100).

Organic solvent: 32 wt % of Propylene glycol phenyl ether (Dowanol PPh, Dow Chemical Company)

Amorphous saturated polyester resin: 8 wt % of the amorphous saturated polyester resin was used. The amorphous saturated polyester resin and Tg of the resin in the each example are shown in Table 1.

The Tg was measured by following procedure with a differential scanning calorimeter (DSC), EXSTAR6000 from Seiko Instruments Inc. An aluminum pan on which 15 mg of the amorphous saturated polyester resin was put was put into a cell in the DSC as well as an aluminum pan as a blank sample. The temperature in the cell was gradually raised up to 150° C. by 10° C./min and cooled down to the room temperature of 25° C. The temperature was raised up to 150° C. by 10° C./min again as a second run. The first transition temperature in the second temperature raise was recorded as the Tg and shown in Table 1. The Tg below 30° C. is shown as <30° C. because it was not measurable in this measuring environment.

Weight-average molecular weight (Mw) was measured by following procedure with a High performance liquid chromatography, Waters LC600 from SpectraLab Scientific Inc.). The measuring conditions are as follows. Column: Shodex GPC K-806L×2 from SHOWA DENKO K.K.; Solvent: tetrahydrofuran: Flow Rate: 1.0 ml/min; Column Temperature: 35° C.; Detector: reflective index; Injection Amount: 100 μl, Sample Concentration: 0.20%; Standard: Polystyrene. The measured weight-average molecular weights (Mw) are shown in Table 1.

The conductive paste was prepared with the folio procedure. The amorphous saturated polyester resin and the organic solvent were mixed in a glass vial for 48 hours at 100° C. The Ag powder was added to the mixture of the resin and solvent and mixed for 5 minutes by a planetary centrifugal mixer to be a conductive paste.

(Manufacture of Test Pieces)

The conductive paste was applied by doctor blade method onto an indium titanium oxide (ITO) layer coated glass substrate. The applying pattern of the conductive paste was square shape (50 mm wide×50 mm long×58 μm thick). The conductive paste on the glass substrate was dried at 150° C. for 5 minutes and then further dried at 200° C. for 12 minutes in an oven (KOYO IR belt furnace) to form an electrode. Thickness of the electrode varied from 29 to 47 μm depending on the conductive pastes.

(Measurement of Adhesion)

Adhesion of the electrode was measured by the following procedures. The glass substrate with the electrode was put on a 90° C. hot plate. A copper ribbon coated with a Sn/Pb solder (Cu—O-155-2-B, Marusho. Co., Ltd.) was dipped into a soldering flux (Kester-955, Kester, Inc.) and then dried for five seconds in air. Half of the solder coated copper ribbon was placed on the electrode and soldering was done by a soldering system (Hakko-926, Hakko Corporation). The soldering iron setting temperature was 400° C. and the actual temperature of the soldering iron at the tip was from 230 to 240° C. measured by K-type thermocouple. The glass substrate with the soldered electrode was taken off the hotplate, and cooled down to the room temperature.

The rest part of the copper ribbon which did not adhere to the electrode was horizontally folded and pulled at 120 mm/min by a machine (Peel Force 606, MOGRL Technology Co., Ltd.). The strength (Newton, N) at which the copper ribbon was detached was recorded as adhesion of the electrode.

(Results)

The adhesion of each example is shown in Table 1. In example 1 to 5, the solar cell electrodes obtained sufficient adhesion over 0.5 N while comparative example 1 to 3 obtained zero adhesion.

TABLE 1

|  | Amorphous saturated polyester resin Tg (° C.) | Mw | Electrode thickness (μm) | Adhesion (N) |
|---|---|---|---|---|
| Com. ex. 1 | 72.2[1] | 57900 | 34 | 0 |
| Com. ex. 2 | 61.8[2] | 49400 | 38 | 0 |
| Com. ex 3 | 51.3[3] | 13200 | 47 | 0 |
| Ex 1 | 47.9[4] | 13200 | 28 | 0.8 |
| Ex 2 | 43.8[5] | 40800 | 28 | 2.1 |
| Ex 3 | 39.4[6] | 50100 | 39 | 1.2 |
| Ex 4 | <30.0[7] | 65300 | 29 | 1.4 |
| Ex 5 | <30.0[8] | 76000 | 40 | 1.0 |

In turn, the effect of the electrode thickness was examined. A solar ode was prepared in the same manner of Example 3 except the applying pattern thickness of the conductive paste and the substrate. The thickness of the applied conductive paste was 6, 13, 26, 39, 52 μm respectively. The substrate was a crystal type silicon wafer coated with a silicon nitride layer or an aluminum (Al) layer instead of the glass substrate coated with the ITO layer. The conductive paste was applied on the silicon nitride layer or the Al layer. The electrode adhesion on the silicon nitride was tested by assuming the conductive paste was applied as a bus bar on the finger lines as illustrated in FIG. 4(b).

The adhesion was measured in the same manner for each of the electrode. The results are shown in Table 2. The adhesion over 1 N was obtained in from Example 6 to Example 9 where the conductive paste was applied with thickness of 13, 26, 39 and 52 μm thick on the silicon nitride layer.

When formed on the aluminum layer, the adhesion over 1N was obtained in Example 10 and Example 11 where the conductive paste was applied with thickness of 39 and 52 μm thick.

TABLE 2

|  | Substrate surface | Thickness (μm) | Adhesion (N) |
|---|---|---|---|
| Comparative example 4 | Silicon nitride | 6 | 0.2 |
| Example 6 | Silicon nitride | 13 | 1.5 |
| Example 7 | Silicon nitride | 26 | 2.5 |
| Example 8 | Silicon nitride | 39 | 2 |
| Example 9 | silicon nitride | 52 | 2.5 |
| Comparative example 5 | Aluminum | 13 | 0 |
| Comparative example 6 | Aluminum | 26 | 0 |
| Example 10 | Aluminum | 39 | 3 |
| Example 11 | Aluminum | 52 | 3.5 |

I claim:

1. A method of manufacturing a solar cell electrode comprising steps of:
   preparing a semiconductor substrate having a preformed electrode on a front side, a back side, or both of the front and the back side of the semiconductor substrate;
   applying a conductive paste onto the preformed electrode, wherein the conductive paste comprises a conductive powder, an amorphous saturated polyester resin with glass transitional temperature (Tg) of 50° C. or lower, and an organic solvent;
   drying the applied conductive paste;
   putting a tab electrode on the dried conductive paste; and
   soldering the tab electrode.

2. The method of manufacturing a solar cell electrode of claim 1, wherein the conductive powder is from 40 to 90 weight percent, the amorphous saturated polyester resin is from 3 to 20 weight percent, and the organic solvent is 5 to 50 weight percent, based on the total weight of the conductive paste.

3. The method of manufacturing a solar ell electrode of claim 1, wherein the preformed electrode is a transparent electrode.

4. The method of manufacturing a solar cell electrode of claim 1, wherein the preformed electrode is a collective electrode comprising a bus bar and a finger line at the front side of the semiconductor substrate.

5. The method of manufacturing a solar cell electrode of claim 1, wherein the preformed electrode is a backside electrode on the back side of the semiconductor substrate.

6. The method of manufacturing a solar cell electrode of claim 1, wherein the conductive paste is dried at from 80 to 250° C. at the drying step.

7. A conductive paste of manufacturing a solar cell electrode, comprising, based on the total weight of the conductive paste;
   40 to 90 weight percent of a conductive powder;
   5 to 50 weight percent of a solvent; and
   3 to 20 weight percent of an amorphous saturated polyester resin with Tg of 50° C. or lower.

* * * * *